United States Patent
Knorr et al.

(10) Patent No.: US 6,531,377 B2
(45) Date of Patent: Mar. 11, 2003

(54) METHOD FOR HIGH ASPECT RATIO GAP FILL USING SEQUENTIAL HDP-CVD

(75) Inventors: Andreas Knorr, Fishkill, NY (US); Mihel Seitz, Wappingers Falls, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/904,799

(22) Filed: Jul. 13, 2001

(65) Prior Publication Data

US 2003/0013271 A1 Jan. 16, 2003

(51) Int. Cl.[7] .............................................. H01L 21/00
(52) U.S. Cl. ........................................ 438/435; 438/424
(58) Field of Search ................................ 438/637, 243, 438/244, 248, 435, 221, 424, 685, 694, 427, 437, 689, 696, 758, 762; 257/304, 306, 311

(56) References Cited

U.S. PATENT DOCUMENTS

| | | | | |
|---|---|---|---|---|
| 5,930,107 A | * | 7/1999 | Rajeevakumar | 257/302 |
| 6,191,004 B1 | * | 2/2001 | Hsiao | 438/435 |
| 6,236,079 B1 | * | 5/2001 | Nitayama et al. | 257/304 |
| 6,294,423 B1 | * | 9/2001 | Malik et al. | 438/241 |
| 6,300,219 B1 | * | 10/2001 | Doan et al. | 438/424 |
| 6,319,796 B1 | * | 10/2001 | Laparra et al. | 438/435 |
| 6,335,239 B1 | * | 1/2002 | Agahi et al. | 438/245 |
| 6,335,261 B1 | * | 1/2002 | Natzel et al. | 438/435 |
| 6,335,288 B1 | * | 1/2002 | Kwan et al. | 438/694 |
| 6,339,241 B1 | * | 1/2002 | Mandelman et al. | 257/301 |
| 6,346,457 B1 | * | 2/2002 | Kawano | 438/424 |
| 6,365,523 B1 | * | 4/2002 | Jang et al. | 438/692 |
| 6,368,912 B1 | * | 4/2002 | Chang et al. | 438/248 |

* cited by examiner

*Primary Examiner*—David Nelms
*Assistant Examiner*—David Vu
(74) *Attorney, Agent, or Firm*—Slater & Matsil, L.L.P.

(57) ABSTRACT

A method of providing isolation between element regions of a semiconductor memory device (200). Isolation trenches (211) are filled using several sequential anisotropic insulating material (216/226/230) HPD-CVD deposition processes, with each deposition process being followed by an isotropic etch back to remove the insulating material (216/226/230) from the isolation trench (211) sidewalls. A nitride liner (225) may be deposited after isolation trench (211) formation. A top portion of the nitride liner (225) may be removed prior to the deposition of the top insulating material (230) layer.

23 Claims, 6 Drawing Sheets

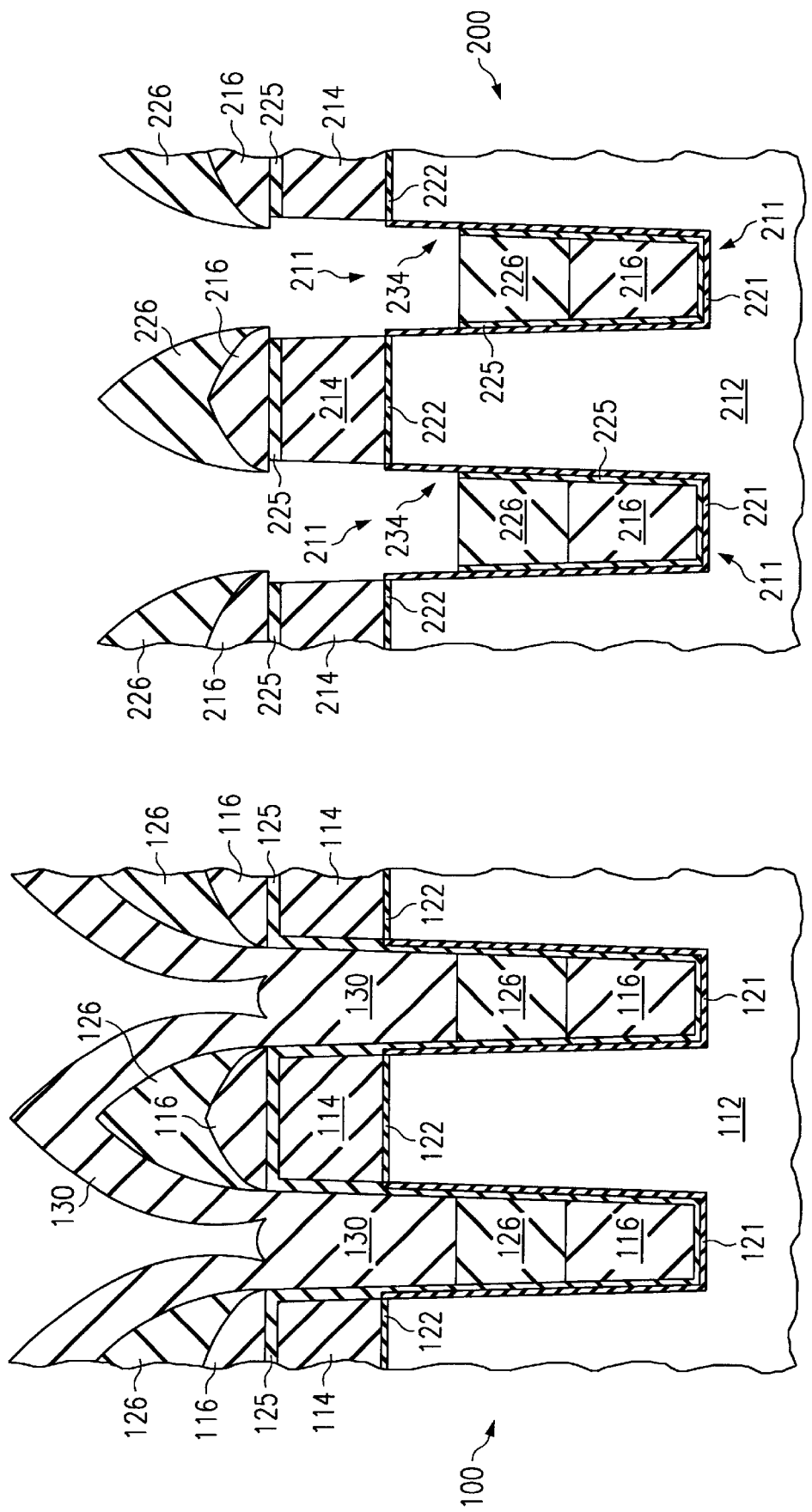

METHOD FOR HIGH ASPECT RATIO GAP FILL USING SEQUENTIAL HDP-CVD

TECHNICAL FIELD

The present invention relates generally to the fabrication of integrated circuits (IC's), and more particularly to the fabrication of memory IC's.

BACKGROUND OF THE INVENTION

Semiconductor devices are used in a variety of electronic applications, such as personal computers and cellular phones, for example. One such semiconductor product widely used in electronic systems for storing data is a semiconductor memory, and one common type of semiconductor is a dynamic random access memory (DRAM).

A DRAM typically includes millions or billions of individual DRAM cells, with each cell storing one bit of data. A DRAM memory cell typically includes an access field effect transistor (FET) and a storage capacitor. The access FET allows the transfer of data charges to and from the storage capacitor during reading and writing operations. In addition, the data charges on the storage capacitor are periodically refreshed during a refresh operation.

Another memory semiconductor device is called a ferroelectric random access memory (FRAM). An FRAM typically has a similar structure to a DRAM but is comprised of materials such that the storage capacitor does not need to be refreshed continuously as in a DRAM. Common applications for FRAM's include cellular phones and digital cameras, for example.

The semiconductor industry in general is being driven to decrease the size of semiconductor devices located on integrated circuits. Miniaturization is generally needed to accommodate the increasing density of circuits necessary for today's semiconductor products. As memory devices such as DRAMs are scaled down in size, various aspects of manufacturing DRAM IC's are becoming more challenging. For example, extreme aspect ratios (the ratio of the vertical depth of a trench to the horizontal width) in small-scale devices present etch and deposition process challenges.

Insulating materials, for example, $SiO_2$, are used to isolate conductors and other active regions in semiconductor devices. In the prior art, in back-end-of-line (BEOL) applications, e.g. for insulation for metal lines, a plasma enhanced chemical vapor deposition (PECVD) process based on a tetraethoxysilane (TEOS) source precursor was typically used for the deposition of insulating material, which resulted in an isotropic or conformal deposition profile. An anisotropic etch was used, such as a physical sputter etch, to remove the insulating material overhangs that covered areas that needed to be filled, and another insulating layer was deposited, e.g., by PECVD.

A technique used to deposit insulators that is being used more frequently in densely-packed semiconductor devices having small feature sizes is high density plasma (HDP) chemical vapor deposition CVD. HDP-CVD has been used in the BEOL in the past, and is also being used in the front-end-of-line (FEOL) for shallow trench isolation (STI). However, HDP-CVD is proving a challenge with today's rapidly increasing high aspect ratio features, which are approaching 4:1 and higher.

FIG. 1 illustrates a prior art semiconductor device 10 having isolation trenches 11 formed in a substrate 12, the isolation trenches 11 having a relatively high aspect ratio. The aspect ratio refers to the ratio of the height (h) compared to the width (w) between the isolation trenches 11, and is expressed as a ratio of h:w, e.g., 3:1 or 4:1.

The semiconductor device 10 in this example comprises a DRAM device, where the trenches 11 comprise isolation trenches (IT's) that are adapted to electrically isolate element regions of a DRAM chip, for example. The element regions may comprise active areas, storage capacitors, transistors, and other electronic elements, as examples. The process of forming IT's is often also referred to in the art as shallow trench isolation (STI), for example.

Prior to formation of the isolation trenches 11 within the substrate 12, a pad nitride 14 may be deposited over the substrate 12. An insulating layer 16 is deposited over the semiconductor wafer 10 using HPD-CVD to fill the trenches between the active areas, as shown. Because of the high aspect ratio h:w which may be 2:1 or greater, the HDP-CVD process may result in voids 20 that form within the trenches 11, as shown. This occurs because an insulator 16 deposited by HDP-CVD has a tendency to form cusps or huts 18 at the vicinity of the top portion of the trenches 11. This results in a greater thickness of the insulating layer 16 on the sidewall at the top of the trenches 11 compared to the sidewall deposition in the lower portion of the trenches 11. As a result, the top of the insulating layer 16 nearer the huts 18 closes, preventing the void regions 20 from being filled. The insulating layer 16 peaks 'pinch' the flow of insulating material 16 reactants into the trenches 11.

A problem in prior art isolation techniques is the formation of these voids 20 in high-aspect ratio trenches. Aggressive aspect ratios in DRAM devices are approaching 4:1 and greater. The gap fill requirement is a function of ground rule layout and critical dimension (CD) tolerances, for example.

As the minimum feature size is made smaller, the oxide gap fill of isolation trenches 11 becomes more challenging, especially in devices such as vertical DRAMs. Leaving voids 20 in a finished semiconductor device may result in device 10 failures. Voids 20 may inadvertently be filled with conductive material in subsequent processing steps such as gate conductor deposition, for example, which may short elements in the substrate.

What is needed in the art is a method of providing isolation and depositing insulating material between high aspect ratio trenches in today's densely-packed semiconductor devices.

SUMMARY OF THE INVENTION

The present invention achieves technical advantages as a method of filling high aspect ratio gaps in semiconductor devices. A first anisotropic insulating layer is deposited and etched with an isotropic etch to remove the first insulating from the sides of the trenches. Additional anisotropic insulating layers are deposited as required for the particular aspect ratio of the trench in order to fill the trench completely without leaving voids within the trench insulating material.

Disclosed is a method of filling gaps between features of a semiconductor wafer, the gaps having sidewalls, the method comprising depositing a first anisotropic insulating material over the wafer to partially fill the gaps, removing the first anisotropic insulating material from at least the gap sidewalls, and depositing a second anisotropic insulating material over the wafer to at least partially fill the gaps.

Also disclosed is a method of isolating element regions of a semiconductor memory device, the memory device including a plurality of isolation trenches separating a plurality of element regions, and the isolation trenches including sidewalls. The method comprises depositing a first insulating material over the isolation trenches, removing a portion of the first insulating material from at least over the isolation trench sidewalls, and depositing a second insulating material over the trenches.

Advantages of embodiments of the present invention include providing a method of filling high aspect ratio gaps in semiconductors such as vertical FETs. A silicon nitride liner may be deposited over the trenches prior to the first insulating layer deposition so that an etch selective to nitride may be used to remove the first insulating layer from the side of trenches in an isotropic etch. The top portion of the silicon nitride liner may be removed prior to the deposition of the top insulating layer, which prevents divot formation on the top surface that may occur during the pad nitride removal. Because only one type of insulating deposition tool is required, the invention does not add an inordinate amount of complexity to the manufacturing process. An inexpensive process such as a wet etch process may be used to remove the insulating layers from the isolation trench sidewalls. The active areas of semiconductor devices are scalable in accordance with the present invention; that is, the number of insulating layers may be varied or increased in accordance with the trench aspect ratio required.

BRIEF DESCRIPTION OF THE DRAWINGS

The above features of the present invention will be more clearly understood from consideration of the following descriptions in connection with accompanying drawings in which:

FIGS. 2–7 illustrate cross-sectional views of an embodiment of the present invention in various stages of manufacturing;

FIGS. 8–10 illustrate an embodiment of the present invention in various manufacturing stages.

Corresponding numerals and symbols in the different figures refer to corresponding parts unless otherwise indicated. The figures are drawn to clearly illustrate the relevant aspects of the preferred embodiments and are not necessarily drawn to scale.

DETAILED DESCRIPTION OF PREFERRED EMBODIMENTS

A description of preferred embodiments of the present invention will be discussed, followed by a discussion of some advantages of the invention. Two isolation trenches are shown in each figure, although many other isolation trenches and other memory cell components may be present in the semiconductor devices shown.

Figure 1:
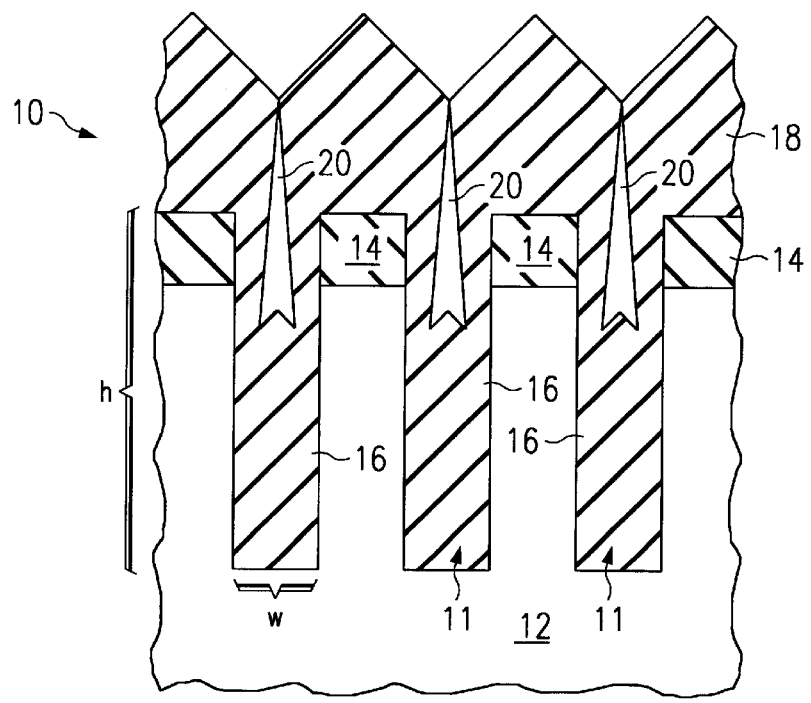
FIG. 1 illustrates a cross-sectional view of a prior art DRAM having voids in the HDP-CVD insulating material between isolation areas or trenches.
Figure 2:
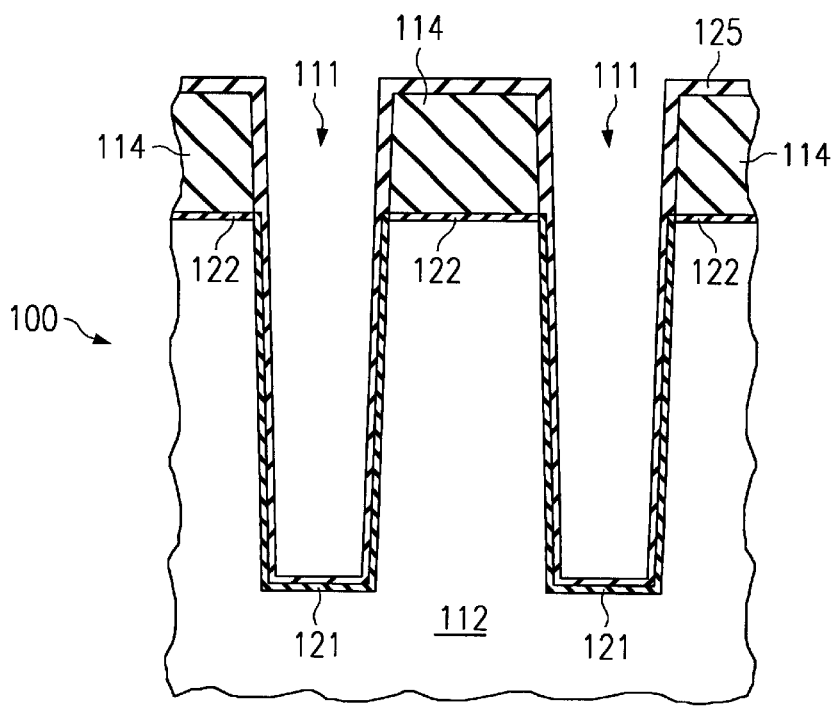

An embodiment of the present invention is shown in cross-section in FIGS. 2–7. Referring first to FIG. 2, a semiconductor wafer 100 having a substrate 112 is provided. The semiconductor device 100 may comprise a DRAM or other memory device, or may alternatively comprise other types of semiconductor devices, as examples. The substrate 112 may comprise silicon or other semiconductor materials, for example. The substrate 112 may include element regions comprising active areas (AA's), storage capacitors and other electronic elements that need to be isolated from one another in the end product. To provide this isolation, isolation trenches 111 are formed within the substrate 112.

Prior to formation of isolation trenches 111, a pad oxide 122 may be formed over the substrate 112. Pad oxide 122 typically comprises approximately 30–100 Angstroms of silicon oxide, for example. A pad nitride 114 may be deposited over the pad oxide 122. Pad nitride 114 may comprise silicon nitride or other nitrides, for example, and may be approximately 1000 Angstroms thick.

Isolation trenches 111 are then formed using a lithography and etch process. Trenches 111 may be 400–800 nanometers deep within the silicon 112, for example, and have aspect ratios of 2:1, 3:1, 4:1 or greater. A sidewall oxide 121 is formed within isolation trenches 111 over the substrate 112. The sidewall oxide 121, also referred to as an active area oxide (AA ox), preferably comprises thermally grown silicon oxide and may be approximately between 50 and 150 Angstroms thick.

Figure 3:
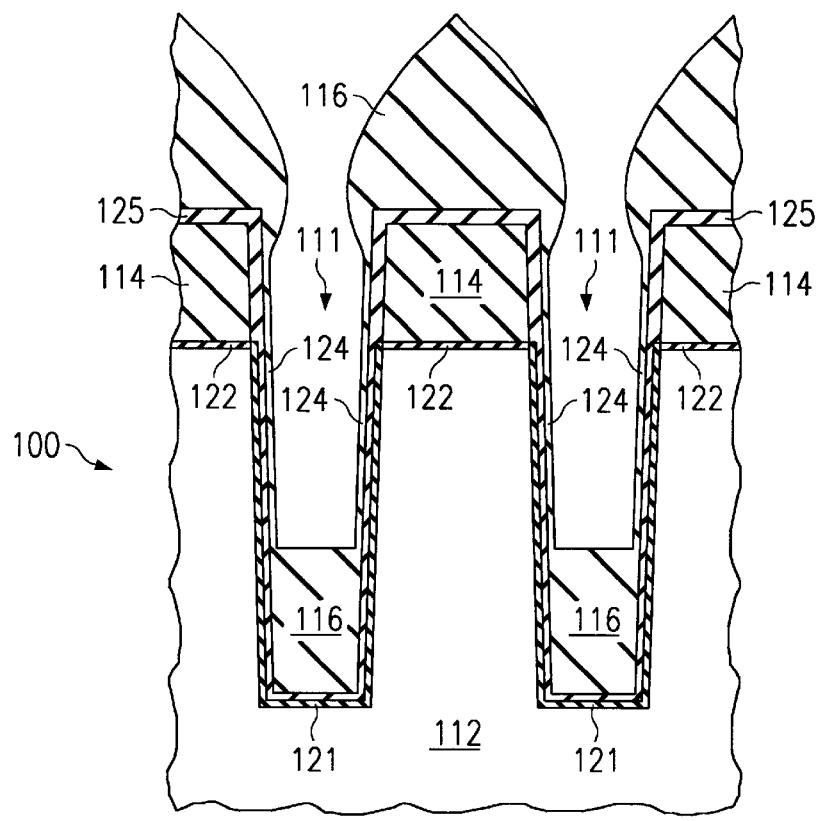

Preferably, an optional nitride liner 125 is deposited within isolation trenches 111 over the pad oxide 121. Nitride liner 125 preferably comprises silicon nitride and may alternatively comprise other nitrides, for example. The nitride liner 125 preferably is approximately 30–100 Angstroms thick. In accordance with the present invention, a first insulating material 116 is deposited over the wafer 100 within the isolation trenches 111, as shown in FIG. 3. First insulating material 116 preferably comprises $SiO_2$ and alternatively may comprise silicon nitride, oxynitride, silicon carbide, compounds thereof, phosphorous silicon-doped glass (PSG), or boron PSG (BPSG), as examples. Preferably, first insulating material 116 is deposited in an anisotropic deposition process, such as HDP-CVD, so that only a small amount of insulating material 116 is deposited on the sides of the isolation trenches 111, shown generally at 124. In particular, the first insulating material 116 is deposited over the substrate 112 topography such that the first insulating material 116 thickness within the bottom of the trenches 111 exceeds the first insulating material 116 thickness on the sidewalls of the trenches 111. The first insulating material 116 is preferably partially deposited within trenches 111 in a thickness of approximately 300 nanometers in the trench 111 bottom, for example.

Figure 4:
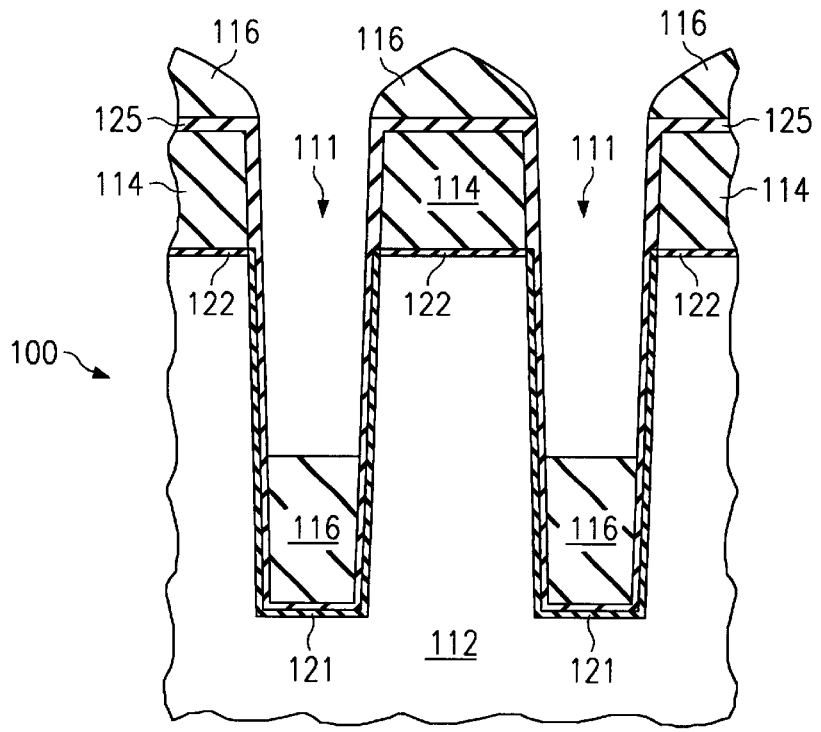

The wafer 100 is exposed to an isotropic etch to remove the first insulating material 116 from at least the sides of the isolation trenches 111, as shown in FIG. 4. Although a small portion of first insulating material may be removed by the isotropic etch from the top surfaces of the wafer 100 and top surface of the first insulating material 116 within the trench, a portion of the first insulating material 116 remains residing within the bottom of the isolation trenches 111 and over the top of the pad nitride 114. In one embodiment, first insulating material 116 comprises an oxide, and because a nitride liner 122 is used, an etch selective to nitride is preferably used. For example, a wet etch comprising buffered HF or other HF-based chemistries, or a dry isotropic etch, e.g. chemical downstream etching (CDE) using fluorine-based chemistries, may be used to remove the first insulating material 116 from the isolation trench 111 sidewalls, for example, when the insulating material 116 comprises $SiO_2$. Alternatively, a timed etch may be used. Approximately 5–50 nanometers of first insulating material 116 is preferably removed.

Figure 5:
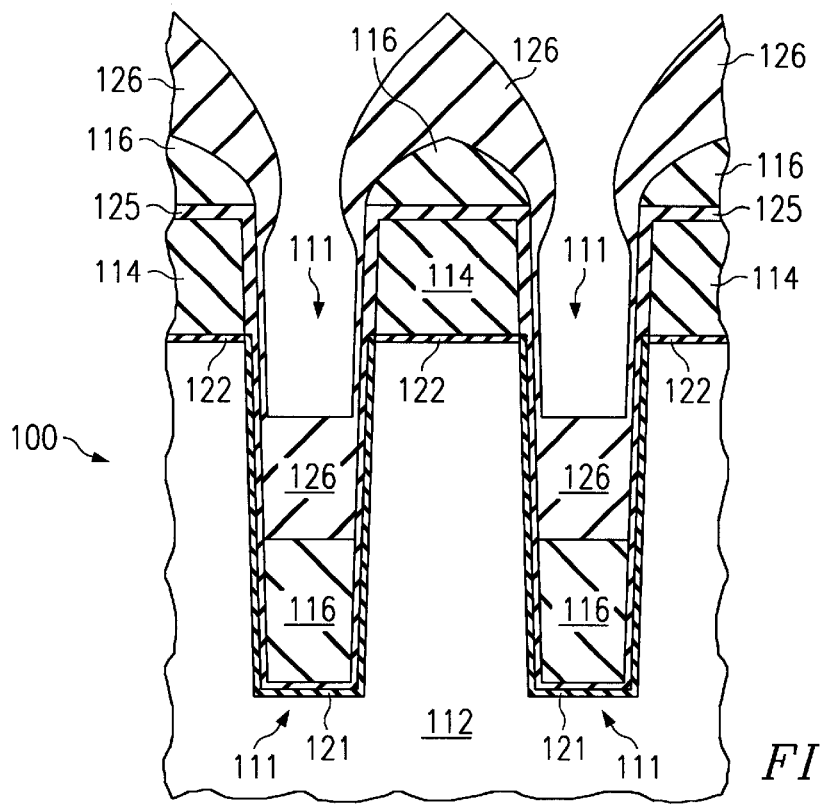

A second insulating material 126 is deposited over the wafer 100, as shown in FIG. 5. Preferably, the second insulating layer 126 comprises oxide deposited by HPD-CVD. Second insulating material 126 preferably comprises SiO$_2$ and alternatively may comprise silicon nitride, oxynitride, silicon carbide, compounds thereof, PSG, or BPSG, as examples. The second insulating material 126 is preferably deposited using an anisotropic deposition process in order to deposit more insulating material 126 over the bottom of the isolation trenches 111 over the first insulating layer 122 than is deposited on the sides of the isolation trenches 111. The second insulating layer 126 may be 400 nanometers, for example.

Figure 6:
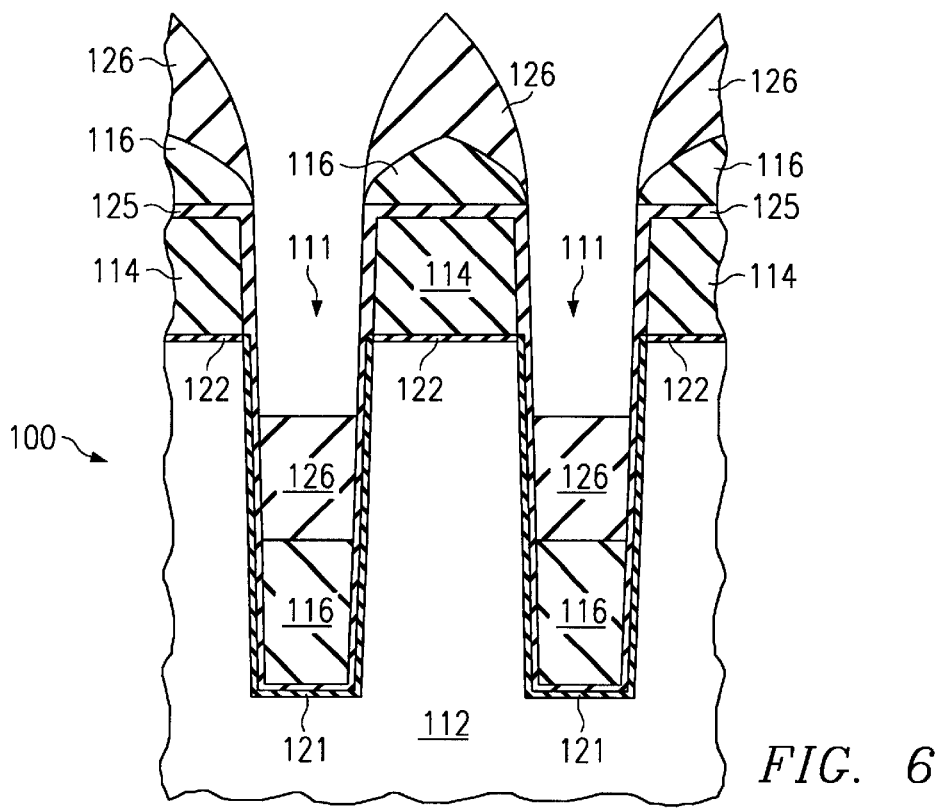

A second isotropic etch process is performed on the wafer 100, as shown in FIG. 6, to remove the second insulating material 126 from at least the sides of the trenches 111. Again, if an oxide is used for second insulating material 126, because a nitride liner 122 is used, an etch selective to nitride may be used to remove the second insulating material 126 from the IT 111 sidewalls. Alternatively, a timed etch may be used. Approximately 10–100 nanometers of second insulating layer 126 is removed in the second etch step, for example.

If the aspect ratio of the trenches 111 is small enough, the second insulating material 126 thickness may be sufficient to completely fill the isolation trenches 111 to the top of the pad nitride 114 layer or greater. In this case, a chemical-mechanical polish (CMP) may be performed (not shown) to remove the undesired insulating material 116 and 126 from the top of the pad nitride 114, and subsequent processing steps may be performed on the wafer 100 to complete the manufacturing process.

However, if the aspect ratio of the isolation trenches 111 is high, e.g. 3:1, 4:1 or greater, a total of three or more additional insulating material layers preferably deposited by HPD-CVD, may be required to fill the isolation trenches 111 and removed from at least the trench 111 sides, in sequential steps. The additional insulating material layers preferably comprise SiO$_2$ and alternatively may comprise silicon nitride, oxynitride, silicon carbide, compounds thereof, PSG, or BPSG, as examples. Like the first 116 and second insulating material 126, the additional insulating material layers are preferably deposited using an anisotropic deposition process in order to deposit more insulating material over the bottom of the isolation trenches 111 than is deposited on the sides of the isolation trenches 111. After each insulating material deposition, the insulating material is removed from at least the isolation trench 111 sides using an isotropic etch, except for the last insulating material deposition.

FIG. 7 shows a cross-sectional view of the wafer 100 having a third insulating material 130 deposited over the wafer 100 within trenches 111. Preferably, the third insulating material 130 is deposited using an anisotropic deposition process such as HDP-CVD to completely fill the isolation trenches 111. A CMP is performed (not shown) to remove the undesired insulating material layers 116/126/130 from the top of the pad nitride 114, and subsequent processing steps are performed on the wafer 100 to complete the manufacturing process.

Because the sequence of insulating material layer 116/126/130 HDP-CVD deposition in the trench 111 and the etch processes to remove the insulating material 116/126/130 from the isolation trench 111 sidewalls results in complete gapfill, there is no possibility of conductive or contaminating materials such as from gate poly-Si or CMP slurry becoming lodged within the isolation trenches 111, creating shorts or defects.

Figure 9:
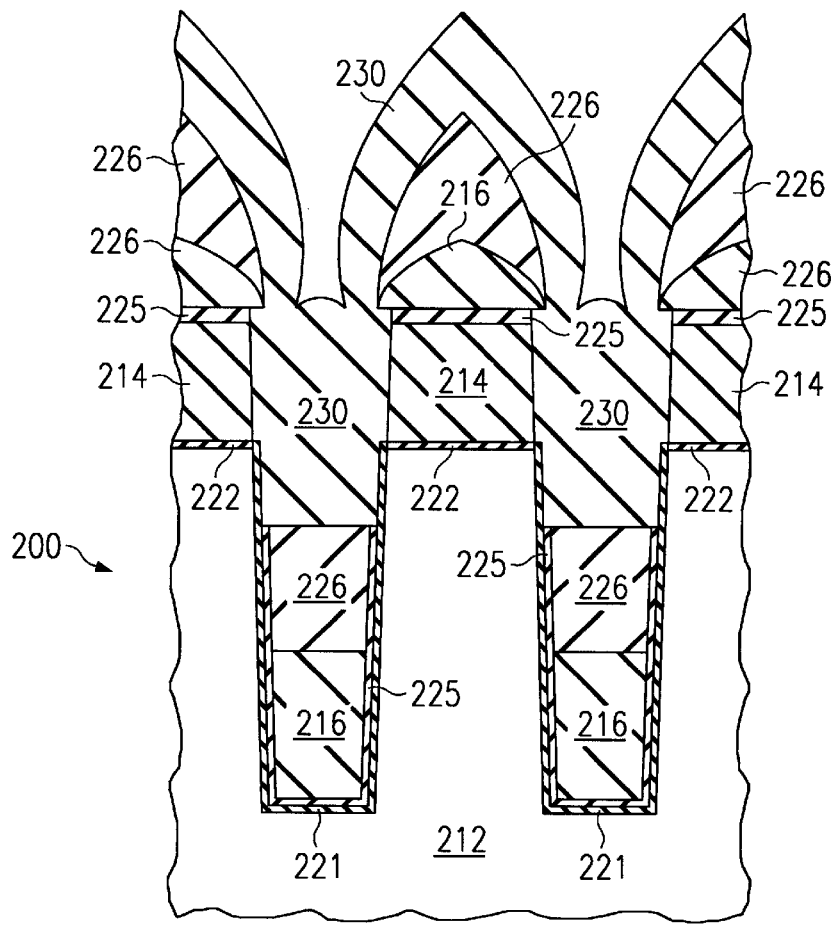
Figure 10:
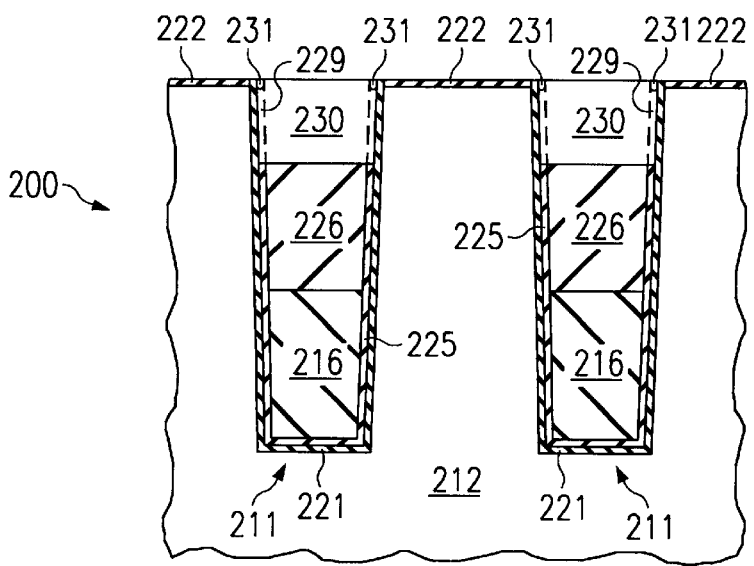

FIGS. 8–10 illustrate another embodiment of the present invention, where before the final insulating material layer 230 is deposited within the isolation trenches 211, the nitride liner 225 is removed from the top region 242 of the trenches 211. In an optional step before the final insulating material layer 230 or 226 is deposited, the nitride liner 225 is etched back, as shown in FIG. 8. Preferably, the nitride liner 225 etch is selective to oxide, and may comprise hot phosphoric acid, for example. The final insulating material layer 230 is deposited over the wafer 200 to fill the isolation trenches 211, as shown in FIG. 9.

When the wafer 200 is polished by CMP to remove the excess insulating material 216/226/230 and pad nitride 214 is stripped, for example, by hot phosphoric acid, from the top of the substrate 212, having removed the nitride liner 225 from the top portion of the isolation trenches 211 is advantageous because the formation of divots 229 along the silicon/insulator interface is prevented. If nitride liner 229 (shown in phantom) is left remaining in the top portion of isolation trenches 211, divots 231 (shown in phantom) may form because silicon nitride 229 is partially removed during the pad nitride 214 strip. The formation of divots 231 in the top surface of the wafer 200 is undesirable because divots 231 may fill in subsequent deposition steps, e.g., of polysilicon, and create shorts. In addition, the removal of the SiN liner 229 improves the reliability of specific PFET devices due to reduced hot carrier degradation of their respective gate oxides.

Figure 11:
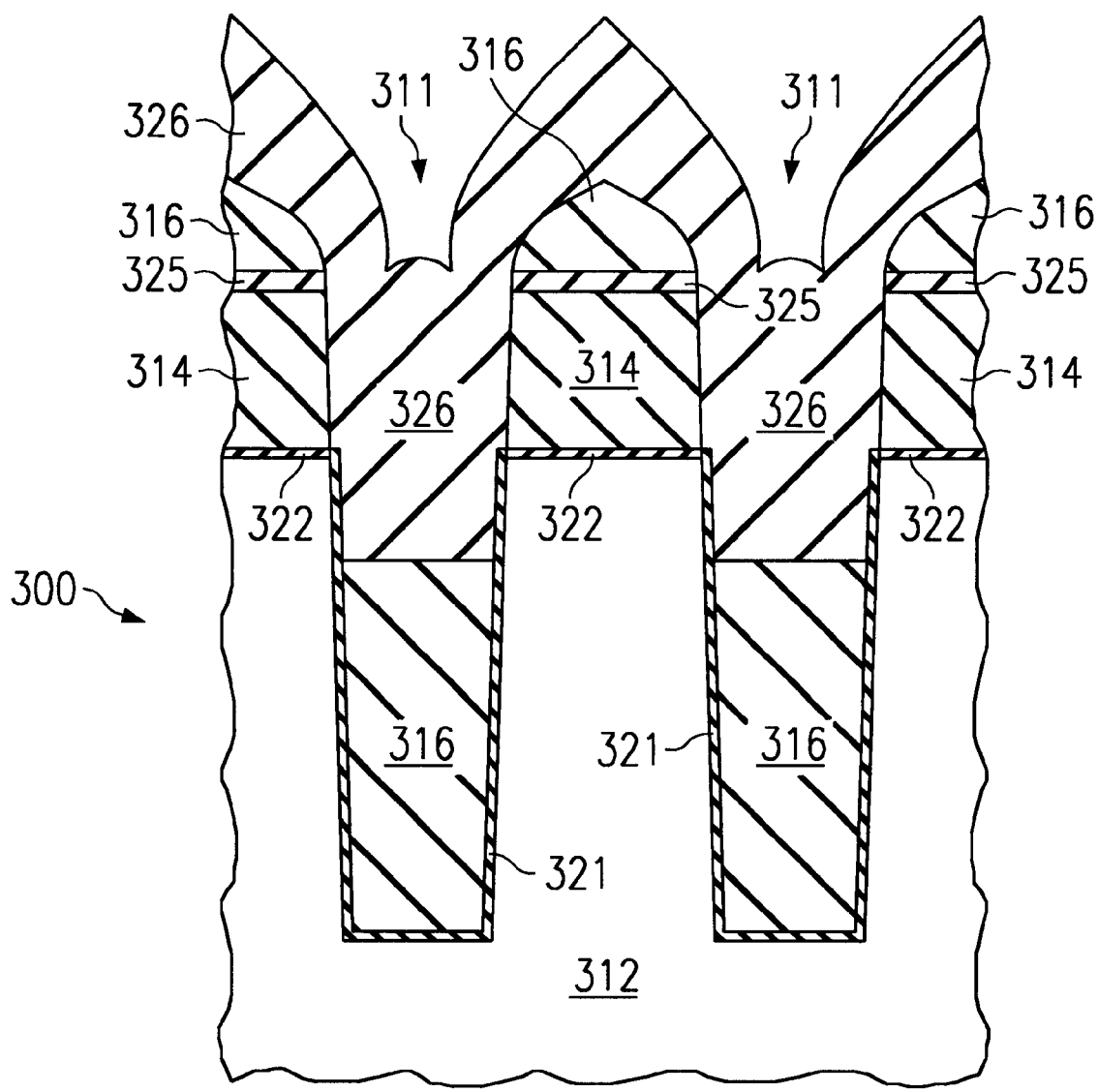
FIG. 11 shows a cross-sectional view of another embodiment of the present invention.

FIG. 11 shows an embodiment of the present invention having sequential layers of insulating material 316/32/330 deposited by HPD-CVD within isolation trenches 311, without the use of a nitride liner 125/225 within the trenches. In this embodiment, rather than using an isotropic etch that is selective to nitride, a timed etch is used to avoid damaging the oxide liner 321 that lines the active areas within the trenches 311, for example. FIG. 11 also illustrates the isolation trenches 311 having an aspect ratio such that two insulating layers 316/326 are sufficient to fill the isolation trenches 311. However, in high aspect ratio isolation trenches 311, two or more insulating layers may be required to completely fill the gaps.

The present invention is described herein as a method of filling isolation trenches in a memory device. However, the present method may also be utilized to fill gaps and provide electrical isolation between topographical features in any semiconductor device. The invention is particularly advantageous when the gaps or trenches have high aspect ratios, e.g. 3:1 or greater (3:1, 4:1, 5:1, etc.).

The present invention achieves technical advantages as a method of filling high aspect ratios isolation trenches 111/211/311 with sequentially deposited layers of insulating material 116/126/130/216/226/230/316/326 that does not leave voids or gaps within the insulating material. Advantages of embodiments of the invention include providing a void-free method of filling high aspect ratio gaps in semiconductors such as vertical DRAMs. A silicon nitride liner 125/225 may be deposited over the isolation trenches 111/211 prior to the insulating material 116/126/130/216/226/230 deposition so that an etch process selective to nitride may be used to remove the insulating material 116/126/216/226 from the side of isolation trenches 111/211 in an isotropic etch. The top portion of the nitride liner 125/225 may be removed prior to the deposition of the top insulating material layer 130/230, which prevents divot formation on the top surface that may occur during the pad nitride 114/214 removal. The invention does not add much complexity to the manufacturing process because only one type of insulating material deposition tool is required, and a wet etch process may be used to remove the insulating material 116/126/216/226/316 from the sides of the isolation trenches 111/211/311, which is an inexpensive process. The active areas of semiconductor devices are scalable in accordance with the present invention, that is, the number of insulating material layers 116/126/130/216/226/230/316/326 may be varied or increased in accordance with the isolation trench 111/211/311 aspect ratio required.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description. For example, while the invention is described herein with reference to a DRAM, it also has useful application in FRAM and other memory and various other types of semiconductor devices. In addition, the order of process steps may be rearranged by one of ordinary skill in the art, yet still be within the scope of the present invention. It is therefore intended that the appended claims encompass any such modifications or embodiments. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A method of filling gaps between features of a semiconductor wafer, the gaps having sidewalls, the method comprising:

depositing a first anisotropic insulating material over the wafer to partially fill the gaps;

removing the first anisotropic insulating material from at least the gap sidewalls using an isotropic etch process; and depositing a second anisotropic insulating material over the wafer to at least partially fill the gaps.

2. The method according to claim 1 further comprising:

removing the second insulating material from at least the gap sidewalls; and depositing a third anisotropic insulating material over the wafer to at least partially fill the gaps.

3. The method according to claim 2 further comprising:

removing the third anisotropic insulating material from at least the gap sidewalls; and depositing a fourth insulating material over the wafer to at least partially fill the gaps.

4. The method according to claim 1 wherein depositing a first and second insulating material comprise a HDP-CVD process.

5. The method according to claim 4 wherein the first and second insulating materials comprise $SiO_2$, silicon nitride, oxynitride, silicon carbide, compounds thereof, phosphorous silicon-doped glass (PSG), or boron PSG (BPSG).

6. The method according to claim 1 wherein the gaps comprise isolation trenches between element regions of a memory device.

7. The method according to claim 6, further comprising depositing a pad nitride over the semiconductor wafer prior to forming the isolation trenches.

8. The method according to claim 7 further comprising depositing a nitride liner within the trenches, before depositing a first insulating material.

9. The method according to claim 8, further comprising removing the nitride liner from a top region of the trenches after depositing the first insulating material.

10. The method according to claim 1, wherein the isotropic etch process is selected from the group consisting of a wet etch, dry etch, and timed etch.

11. A method of isolating element regions of a semiconductor memory device, the memory device including a plurality of isolation trenches separating a plurality of element regions, the isolation trenches including sidewalls, the method comprising:

depositing a first insulating material over the isolation trenches;

removing a portion of the first insulating material from at least over the isolation trench sidewalls using an isotropic process; and depositing a second insulating material over the trenches.

12. The method according to claim 11 wherein depositing a first and second insulating material comprise an anisotropic process.

13. The method according to claim 12 wherein depositing a first and second insulating material comprise a HDP-CVD process.

14. The method according to claim 13 further comprising:

depositing a nitride liner within the isolation trenches, before depositing a first insulating material; and removing the nitride liner from a top region of the trenches after removing the first insulating material from the isolation trench sidewalls.

15. The method according to claim 11 wherein the isolation trenches have aspect ratios of 3:1 or greater.

16. The method according to claim 11 further comprising:

removing the second insulating material from at least the isolation trench sidewalls; and depositing a third insulating material over the wafer to at least partially fill the isolation trenches.

17. The method according to claim 16 further comprising:

depositing a nitride liner within the isolation trenches, before depositing a first insulating material; and removing the nitride liner from a top region of the trenches after removing the second insulating material from the isolation trench sidewalls.

18. The method according to claim 16, wherein depositing a first, second and third insulating material comprise an anisotropic HDP-CVD process, wherein removing the second insulating material comprises an isotropic etch process.

19. The method according to claim 16 further comprising:

removing the third insulating material from at least the isolation trench sidewalls; and depositing a fourth insulating material over the wafer to at least partially fill the isolation trenches.

20. The method according to claim 19 further comprising:

depositing a nitride liner within the isolation trenches, before depositing a first insulating material; and removing the nitride liner from a top region of the trenches after removing the third insulating material from the isolation trench sidewalls.

21. The method according to claim 19, wherein depositing a first, second, third and fourth insulating material comprise an anisotropic HDP-CVD process, wherein removing the second and third insulating materials comprise an isotropic etch process.

22. The method according to claim 11, further comprising depositing a pad nitride over the semiconductor wafer prior to forming the isolation trenches.

23. The method according to claim 11, wherein the isotropic etch process is selected from the group consisting of a wet etch, dry etch, and timed etch.

* * * * *